(12) United States Patent
Ting et al.

(10) Patent No.: US 6,791,382 B1
(45) Date of Patent: Sep. 14, 2004

(54) NOISE REDUCTION METHOD AND SYSTEM FOR A MULTIPLE CLOCK, MIXED SIGNAL INTEGRATED CIRCUIT

(75) Inventors: Tah-Kang Joseph Ting, Hsinchu (TW); Gyh-Bin Wang, Chung-Li (TW); Ming-Song Huang, Chung-Li (TW)

(73) Assignee: Etron Technology, Inc., Hsin-Chu (TW)

( * ) Notice: Subject to any disclaimer, the term of this patent is extended or adjusted under 35 U.S.C. 154(b) by 300 days.

(21) Appl. No.: 10/117,951

(22) Filed: Apr. 8, 2002

(51) Int. Cl.$^7$ .................................................. H03L 7/06
(52) U.S. Cl. ...................................................... 327/156
(58) Field of Search ................................ 327/156, 551, 327/147, 141

(56) References Cited

U.S. PATENT DOCUMENTS

| | | | |
|---|---|---|---|
| 4,943,787 A | * | 7/1990 | Swapp .......................... 331/2 |
| 5,652,532 A | * | 7/1997 | Yamaguchi ................... 327/39 |
| 5,731,737 A | | 3/1998 | Cranford, Jr. et al. ...... 327/553 |
| 6,215,423 B1 | | 4/2001 | May et al. ..................... 341/61 |
| 6,232,905 B1 | | 5/2001 | Smith et al. ................. 341/155 |

* cited by examiner

*Primary Examiner*—Dinh T. Le
(74) *Attorney, Agent, or Firm*—George O. Saile; Stephen B. Ackerman; Douglas R. Schnabel

(57) ABSTRACT

A method to reduce clock noise in a multiple clock circuit is achieved. The method comprises, first, providing a periodic signal. Next, a first clock signal is provided having a frequency that is a constant multiple of the frequency of the periodic signal. Finally, a second clock signal is derived from the periodic signal. The second clock signal has a frequency that is a non-constant multiple of the periodic signal frequency. The non-constant multiple comprises the sum of a constant value plus a time-varying value. The spectral energy at the sum and difference frequencies of the first and second clock signals is reduced by frequency distribution spreading. A circuit is achieved comprising the above method.

35 Claims, 4 Drawing Sheets

NOISE REDUCTION METHOD AND SYSTEM FOR A MULTIPLE CLOCK, MIXED SIGNAL INTEGRATED CIRCUIT

BACKGROUND OF THE INVENTION (1) Field of the Invention

The invention relates to a method and system to reduce clock noise in a multiple clock circuit, and, more particularly, to a method and system to reduce clock noise caused by frequency sum and difference components using a spectral energy spreading technique.

(2) Description of the Prior Art

In the art of integrated circuits, clock signals are used to time or synchronize circuit operators. Sometimes more than one clock signal frequency must be used in the circuit. In such cases, the circuit is said to be a multiple clock circuit. Referring now to FIG. 1, an example of multiple clock integrated circuit is shown. In this example, the integrated circuit device 10 is a mixed signal IC. In a mixed signal IC, analog and digital circuits are integrated in a common, system on chip (SOC) approach. The circuit has a set of inputs (IN) 14 and a set of outputs (OUT) 18.

Two clock signals, CLK1 22 and CLK 26, are used on the circuit device 10. While the two clocks are shown as externally accessible, these clock signals may be only internally available. Further, CLK1 22 and CLK2 26 comprise different frequencies, $f_1$ and $f_2$. It is known in the art that, if cyclical signals interact, or couple, then this interaction can create signals having frequencies that are related to the original signals. In particular, clock signals CLK1 and CLK2 can interact to create unwanted, or noise, signals at the frequencies represented by the sum and difference of the original frequencies. More specifically, the interaction of CLK1 and CLK2 will create noise components at $f_{NOISE1}=f_1+f_2$, and $f_{NOISE1}=f_1-f_2$. The spectral energy of the clock signals $f_1$ 32 and $f_2$ 36 is shown in FIG. 1. In addition, the spectral energy of the noise products at $f_1-f_2$ 40 and $f_1-f_2$ 44 are shown.

In practice, when multiple clock frequencies are used on a single device 10, attempts are made to isolate the clock signals one from another. For example, separate power and ground routings and/or separate power and ground external connections may be used to isolate circuit sections having different clock frequencies. In addition, the CLK1 and CLK2 areas may be separated by physical layout distance to reduce capacitance coupling effects. However, the fact that the device 10 of the example is a mixed signal circuit makes the problem more difficult to solve. Digital circuits typically can operate successfully in the presence of relatively large clock switching noise. However, analog circuits, by nature, can be very sensitive to noise. For example, an analog-to-digital converter circuit may not function properly in the presence of as little as 4 millivolts of substrate noise. Traditional layout and routing techniques may not adequately reduce clock interaction, and, therefore, spectral combination noise may still occur. In addition, these approaches use precious I/O pins and layout area.

Referring now to FIG. 2, a particular mixed signal device example is shown. In this example, a liquid crystal display (LCD) controller 50 is shown. The LCD controller 50 is used to convert an analog video signal 62, here comprising the red-green-blue (RGB) analog video from a PC video card 54, into a digital RGB video signal 64 to drive a LCD panel 58. In this situation, the LCD controller 50 performs two critical functions. First, the analog video signal 62 must be converted into a digital signal using the analog input section 68 of the device 50. Second, the analog video input 62 from the video card 54 may be configured to any of several different resolutions for XGA, SVGA, or VGA formats. For example, the PC video card may be configured to source 1024×768 pixels or to source 800×600 pixels. Many other screen formats could be configured. However, the LCD panel 58 is a fixed resolution device. Therefore, the second function of the LCD controller 50 is to map, or scale, the variable resolution video input 62 to a fixed resolution output 64.

To perform the major functions of analog-to-digital conversion (ADC) and scaling, the LCD controller 50 is designed as an analog section 68 and a digital scaling section 72. While the ADC is essentially an analog device, a first clock signal CLK1 74 is used to control when the analog video signals (RGB) 62 are sampled. CLK1 74 is derived from a horizontal synchronization signal (HSYNC) that indicates the beginning of each horizontal line of video data. Typically, CLK1 74 is derived from HSYNC using a phase lock loop circuit (PLL) and has a frequency of M times the HSYNC frequency where M is the number of pixels per horizontal line of data.

After the analog video data 62 is converted to a stream of digital data by the ADC section 68, this digital data must be scaled to the fixed output resolution. For example, an input resolution of 800 pixels per line may have to be scaled to a fixed output resolution of 1024 pixels per line. To execute the scaling function, a digital scaling section 72 uses a second clock signal CLK2 76. CLK2 76 must also be derived, or synchronized, to HSYNC but at a different frequency than that used for CLK1 74. CLK2 76 is then used by the LCD panel 58 to synchronize the data stream output 64.

The combination of CLK1 74 and CLK2 76 on the mixed signal, LCD controller 50 presents a potentially troublesome noise situation. Once again, the coupling of the clock signals can cause additional frequency components at the sum and difference frequencies. In particular, the difference noise component, $f_1-f_2$, can couple into the ADC section 68. This noise component shows up in the LCD panel 58 display data as visible noise lines 80. These noise lines 80 are undesirable and need to be eliminated.

Several prior art inventions relate to methods and circuits for reducing clock noise on a device. U.S. Pat. No. 6,232,905 to Smith et al discloses a clocking technique to reduce sampling noise in an analog-to-digital converter (ADC). The technique uses a clean, low frequency clock to disable the ADC sample rather than using the noisy, phase lock loop (PLL) derived clock. U.S. Pat. No. 6,215,423 to May et al describes a method and a system for asynchronous sample rate conversion using a noise-shaped, numerically controlled oscillator. The oscillator generates a clock that is synchronous to the system clock but that has a time average frequency that is equal to a multiple of the asynchronous sampling rate. Unwanted spectral energy is noise-shaped out of the passband. No PLL is used. U.S. Pat. No. 5,731,737 to Cranford, Jr. et al teaches a method and a system to reduce clock-switching noise in a continuous time filter.

SUMMARY OF THE INVENTION

A principal object of the present invention is to provide an effective and very manufacturable method and system for reducing clock noise in a multiple clock system.

A further object of the present invention is to provide a method and system to reduce harmonic, frequency sum and difference noise in a multiple clock system.

A yet further object of the present invention is to reduce noise by spreading the spectral energy of a clock signal to thereby spread the spectral energy of the sum and difference components.

A still yet further object of the present invention is to derive a clock having a frequency that is a non-constant multiple of a periodic signal where the non-constant multiple is a sum of a constant value and a time varying value.

Another still yet further object of the present invention is to derive a clock having a non-constant multiple frequency of a periodic signal by using a phase lock loop (PLL) circuit.

Another further object of the present invention is to provide a clock reduction method and system for a LCD controller device particularly as it relates to the conversion of analog video to digital video.

In accordance with the objects of this invention, a method to reduce clock noise in a multiple clock circuit is achieved. The method comprises, first, providing a periodic signal. Next, a first clock signal is provided having a frequency that is a constant multiple of the frequency of the periodic signal. Finally, a second clock signal is derived from the periodic signal. The second clock signal has a frequency that is a non-constant multiple of the periodic signal frequency. The non-constant multiple comprises the sum of a constant value plus a time-varying value. The spectral energy at the sum and difference frequencies of the first and second clock signals is reduced by frequency distribution spreading.

Also in accordance with the objects of this invention, a multiple clock generating circuit having reduced clock noise is achieved. The circuit comprises, first, a means of deriving a first clock signal from a periodic signal. The first clock signal has a frequency that is a constant multiple of the frequency of the periodic signal. Second, a phase lock loop issued for deriving a second clock signal from the periodic signal. The second clock signal has a frequency that is a non-constant multiple of the periodic signal frequency. The non-constant multiple comprises the sum of a constant value plus a time-varying value. The spectral energy at the sum and difference frequencies of the first and second clock signals is reduced by frequency distribution spreading.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method and system to reduce clock noise in a multiple clock circuit. It should be clear to those experienced in the art that the present invention can be applied and extended without deviating from the scope of the present invention.

Figure 1:
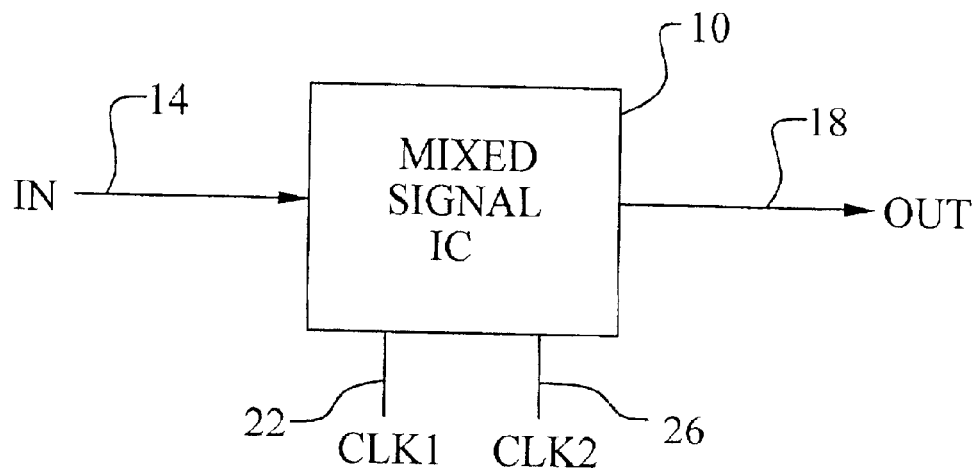
FIG. 1 illustrates a multiple clock, mixed signal integrated circuit and illustrates the problem of frequency sum and difference noise components.
Figure 1:
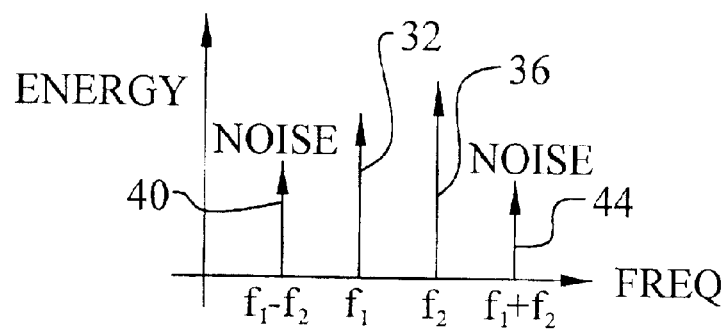
Figure 2:
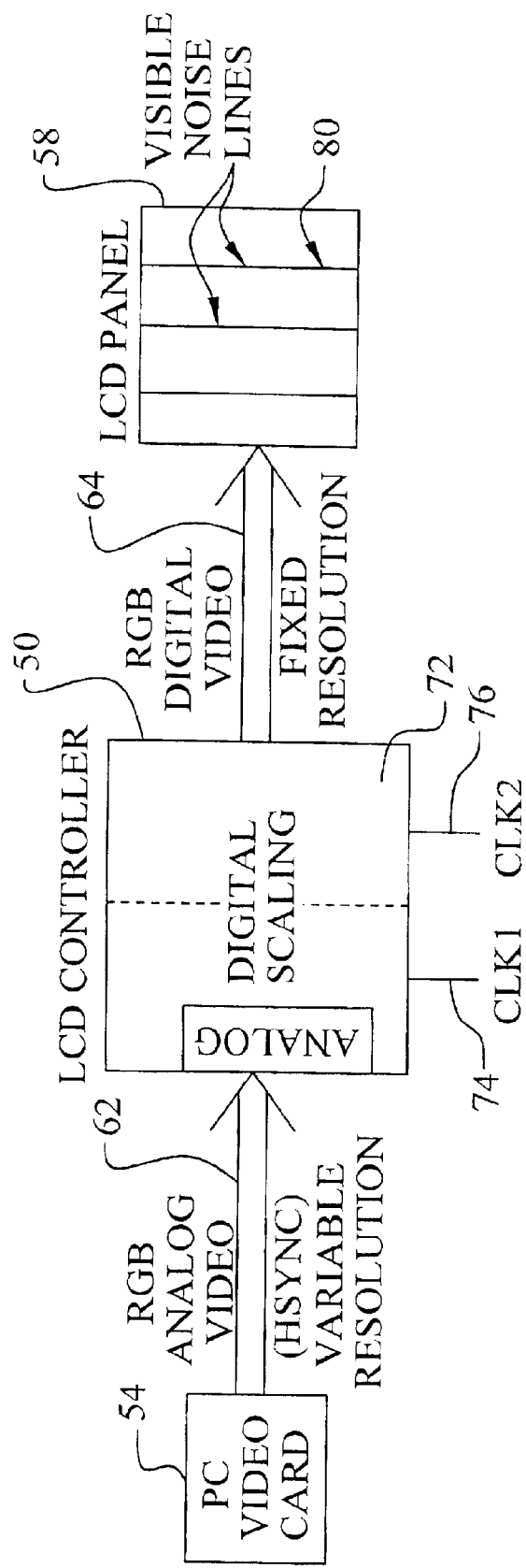
FIG. 2 illustrates a liquid crystal display (LCD) controller system for converting analog video into digital video and illustrates the problem of multiple clock, harmonic noise interference on the LCD panel.
Figure 3:
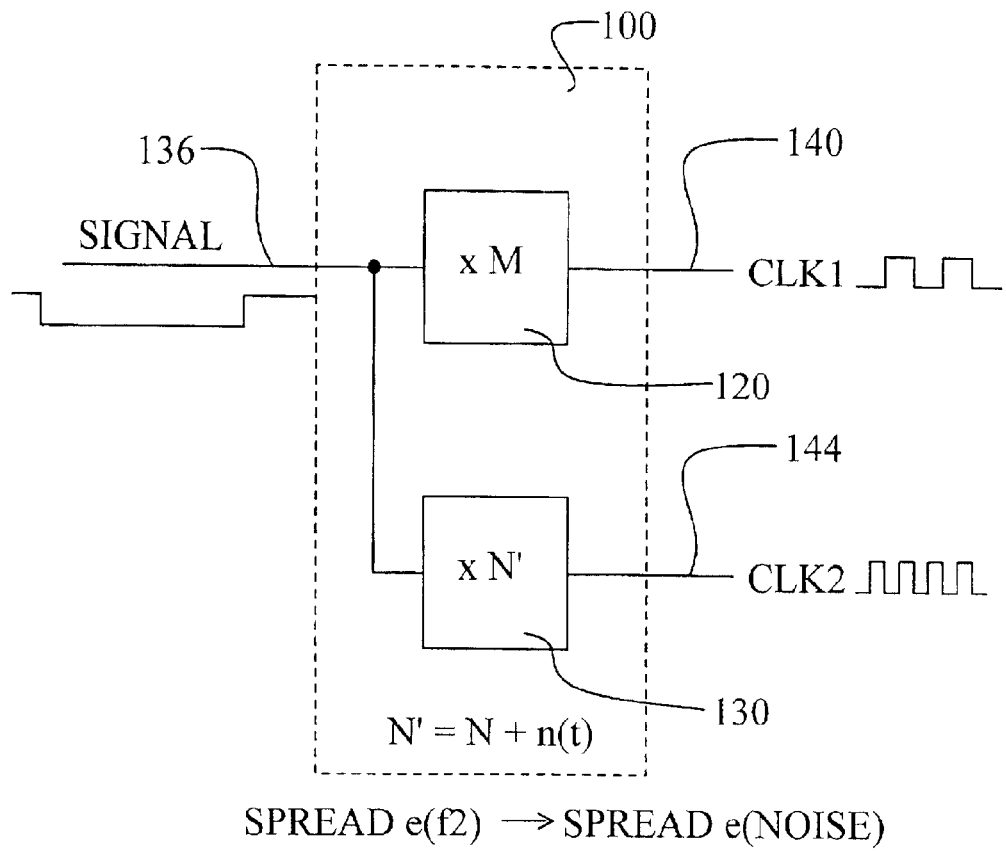
FIG. 3 illustrates the preferred embodiment of the present invention method to reduce clock noise in a multiple clock circuit via frequency spreading.
Figure 3:
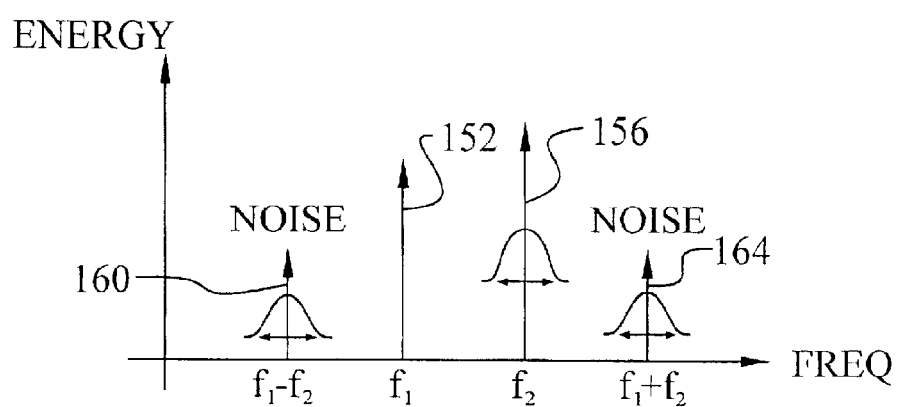

Referring now to FIG. 3, the preferred embodiment of the present invention method and system 100 to reduce clock noise in a multiple clock circuit via frequency spreading is shown. Several important features of the present invention are shown in the illustration and are further describe below. The method and system 100, herein shown in block function form, comprises, first, providing a periodic signal, SIGNAL 136. For example, the periodic signal SIGNAL 136 may comprise the HSYNC video signal of the example circuit in FIG. 2. Referring again to FIG. 3, a first clock signal, CLK1 140 is provided. CLK1 140 has a frequency that is a constant multiple, M, of the frequency of the periodic signal. In the preferred embodiment, CLK1 140 is derived from SIGNAL 136 using a means of deriving 120 and, more preferably, this means of deriving CLK1 from SIGNAL comprises a PLL. Further, the CLK1 signal may comprise an ADC sampling signal such as described in FIG. 2 above.

Referring again to FIG. 3, finally, a second clock signal, CLK2 144, is derived from the periodic signal SIGNAL 136. CLK2 144 has a frequency that is a non-constant multiple, N', of the periodic signal frequency of SIGNAL 136. This is a very important feature of the present invention. The non-constant multiple N' comprises the sum of a constant value, N, plus a time-varying value n(t). By introducing a time-varying value, n(t), into the multiplier for the derived CLK2 144, the novel method of the present invention effectively spreads the spectral energy of the second clock signal. Referring now to the spectral energy diagram, the energy of the second clock signal, signified by $f_2$ 156, is spread across a range of values. This is because the time-varying component n(t) causes the resulting CLK2 frequency to have the value $f_2=f_{SIGNAL}\times(N+n(t))$. Therefore, the CLK2 frequency has a time-variable component that causes the spectral energy to be spread when compared to the more spectral-concentrated energy of the first clock CLK1, signified by $f_1$ 152.

More importantly, the spectral energy at the sum and difference frequencies, $f_1-f_2$ 160 and $f_1+f_2$ 164, of the first and second clock signals, CLK1 140 and CLK2 144, is reduced by this frequency distribution spreading. This is a particularly important observation in the LCD controller case of FIG. 2. The main problem observed in the LCD controller is not due to the scaling frequency of CLK2. Rather, the problem is observed due to the difference frequency between CLK1 and CLK2. By spreading the spectral energy at the sum and difference frequencies, and, most particularly, the difference frequency ($f_1-f_2$), the novel method of the present invention removes the visible noise lines from the LCD panel. The resulting noise components no longer align in fixed frequency bands. Rather, the noise is scattered or scrambled so that the static effects of the noise are reduced.

Assuming the novel method is used for the LCD controller device 50 in FIG. 2, then the CLK2 signal 76 provides synchronization for the output data 64 for the LCD panel 58. If the fixed resolution of the panel 58 is 1024 pixels per line, then the target frequency for the CLK2 signal 76 would be the HSYNC frequency times 1024. Therefore, in the equation for the non-constant multiple, N', the constant value N would equal 1024. However, the frequency of CLK2 76 would not simply be $f_{SYNC}\times1024$. Rather, CLK2 would be derived with a frequency equal to $f_{SYNC}\times(1024+n(t))$. The nominal CLK2 frequency, $f_2$, would equal $f_{SYNC}\times1024$.

However, the time varying component, n(t) would cause the actual frequency to vary around the center point of $f_{SYNC}$. This spectral spread version of CLK2 has the advantage of not sustaining the difference noise frequency that causes the noise lines 80. The time variation on CLK2 does not cause a problem for LCD panel control because the output data 64 remains in synchronization with CLK2.

Figure 4:
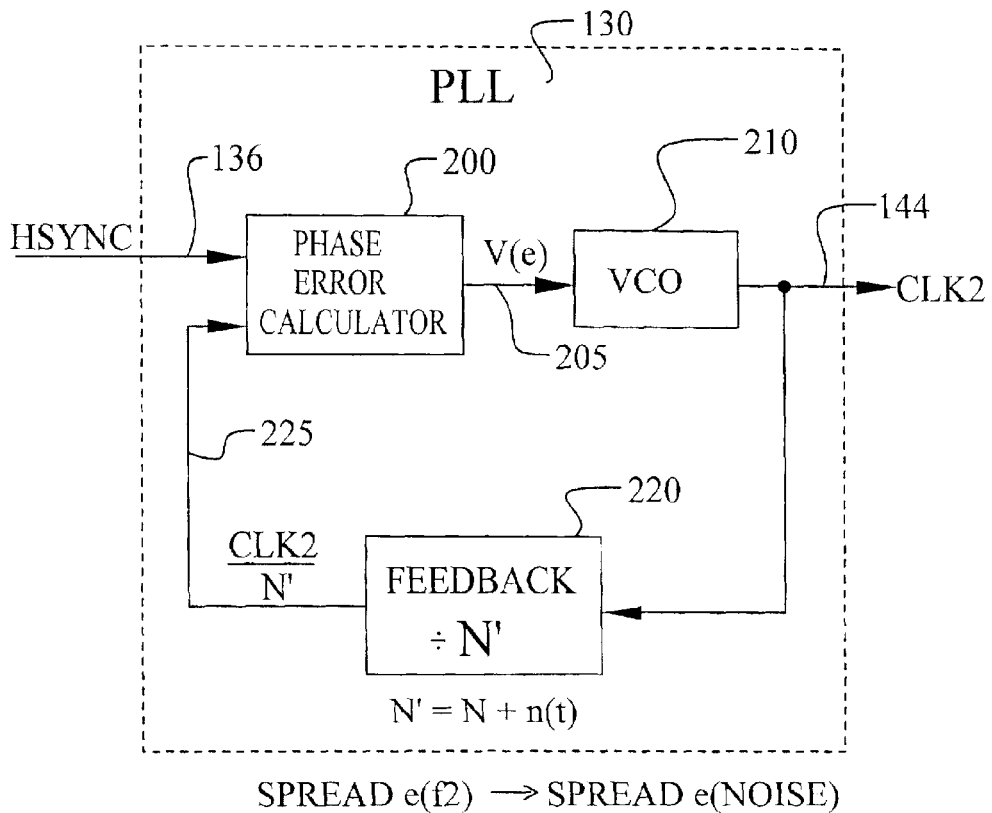
FIG. 4 illustrates a preferred embodiment of a PLL circuit to generate a clock signal having a spread spectral energy content.

Referring again to FIG. 3, in the preferred embodiment, the means of deriving 130 the second clock signal CLK2 144 from the periodic signal SIGNAL 136 preferably comprises a PLL circuit having a non-constant multiple N'. Referring now to FIG. 4, a preferred embodiment PLL circuit 130 to generate a clock signal having a spread spectral energy content is shown. In this illustration, the preferred features of a PLL circuit 130 for deriving the second clock signal CLK2 144 are shown. The circuit comprises, first, a phase error calculator 200 having first input and second input and an output. The output V(e) 205 preferably comprises a constant voltage plus a voltage proportional to a phase error between the first and second inputs. The first input is coupled to the periodic signal, HSYNC 136. Second, a voltage-controlled oscillator (VCO) 210 has an input and an output. The VCO output comprises a frequency that is proportional to the phase error calculator output V(e) 205 and comprises CLK2 144. Finally, a feedback means 220 has an input and an output. The frequency of the feedback means 220 output 225 is equal to the frequency of the input CLK2 144 divided by the non-constant multiple N'. Most importantly, the non-constant multiple N' equals a constant value N and a time-varying value n(t).

Figure 5:
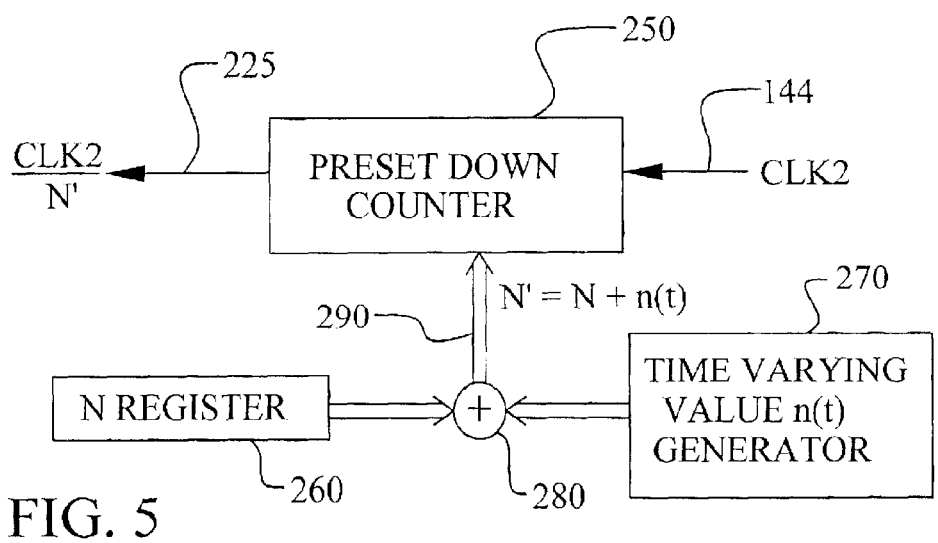
FIG. 5 illustrates a preferred embodiment of a feedback "÷N'" circuit.

The non-constant multiple N' may be derived in several ways. Referring now to FIG. 5, an example method of deriving N' is shown. This is a representative example and is not primary to the critical embodiments of the present invention. A preset down counter 250 is herein used. A preset down counter 250 is a counter that may be loaded with a preset value. Then, after the preset value is loaded, the counter 250 is decremented one count for every clock cycle. In this case, the counter 250 would decrement every cycle of CLK2 144. The preset value 290 is the non-constant multiple N'=N+n(t). In this example, the constant value N is held in a register 260. The time-varying value n(t) is generated separately in the generator block 270.

The value of the time-varying generator 270 changes on a periodic basis. Preferably, the time-varying value n(t) changes at the cycle of the period signal, for example HSYNC, from which CLK2 is derived. The value n(t) is then added to 280 or subtracted from the constant value N 260 to create N' 290. When the preset down counter 250 counts out, then he new non-constant multiple N' 290 is preset into the counter 250 to be used as the basis for the next cycle.

In the preferred embodiment, the time-varying value n(t) has two components, a magnitude and a changing frequency. For example, n(t) may have a magnitude of 1 and changing frequency of every 2 lines (or every 2 HSYNC cycles). In this scenario, n(t) would equal 1 for two lines of output to the display, then would equal –1 for two lines of output, then would equal 1, and so on. Consequently, the constant multiple N' 290 would oscillate between the value N–1 for two lines, the value N+1 for the next two lines, and so on. If the magnitude of n(t) was 3, then n(t) would oscillate between 3 and –3. Typical ranges of magnitude of between about 1 and about 5 are used. Typical changing rates of between about 2 lines per change and about 5 lines per change are used.

In the preferred embodiment, the n(t) magnitude and frequency is programmable through a microprocessor or hardware controller. This programmability feature allows for optimization of a system design prior to final product delivery. The n(t) value should be adjusted to a value sufficient to cause spectral spreading and to reduce the sum and difference noise components. However, the n(t) value should be small enough to not interfere with the functional requirements of the clocking signal.

The present invention is illustrated for the LCD controller case. However, the method and circuit of the present invention will work for any multiple clock system and, particularly, for mixed signal, multiple clock systems. The present invention will work whether the constant frequency (CLK1) clock signal is derived using a PLL or by another method.

The advantages of the present invention may now be summarized. An effective and very manufacturable method and system for reducing clock noise in a multiple clock system is achieved. The method and system reduces harmonic, frequency sum and difference noise in a multiple clock system. The clock noise is reduced by spreading the spectral energy of a clock signal to thereby spread the spectral energy of the sum and difference components. A clock is derived having a frequency that is a non-constant multiple of a periodic signal where the non-constant multiple is a sum of a constant value and a time varying value. This clock is derived by using a phase lock loop (PLL) circuit. The method and system is applicable for a LCD controller device particularly as it relates to the conversion of analog video to digital video.

As shown in the preferred embodiments, the novel method and system for reducing clock noise in a multiple clock system provides an effective alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to reduce clock noise in a multiple clock circuit comprising:

provide a periodic signal;

providing a first clock signal having a frequency that is a constant multiple of the frequency of said periodic signal; and deriving a second clock signal from said periodic signal wherein said second clock signal has a frequency that is a non-constant multiple of said periodic signal frequency, wherein said non-constant multiple comprises the sum of a constant value plus a time-varying value, and wherein the spectral energy at the sum and difference frequencies of said first and second clock signals is reduced by frequency distribution spreading.

2. The method according to claim 1 wherein said step of providing said first clock signal further comprises deriving said first clock signal from said periodic signal using a phase lock loop having said constant multiple.

3. The method according to claim 1 wherein said step of deriving said second clock signal from said periodic signal comprises using a phase lock loop having said non-constant multiple.

4. The method according to claim 1 wherein said time-varying value comprises a magnitude and a changing frequency.

5. The method according to claim 4 wherein said time-varying value magnitude comprises a value of between about 1 and about 5.

6. The method according to claim 4 wherein said time-varying value changing frequency comprises a value of between about every 2 lines per change and about every 5 lines per change.

7. The method according to claim 1 wherein said periodic signal comprises a video horizontal synchronization signal.

8. The method according to claim 1 wherein said first clock signal comprises a sampling signal for an analog video input signal.

9. The method according to claim 1 wherein said second clock signal comprises synchronizing signal for a digital video output signal.

10. A method to reduce clock noise in a multiple clock circuit comprising:
   providing a periodic signal;
   deriving a first clock signal from said periodic signal using a phase lock loop wherein said first clock signal has a frequency that is a constant multiple of the frequency of said periodic signal; and
   deriving a second clock signal from said periodic signal using a phase lock loop wherein said second clock signal has a frequency that is a non-constant multiple of said periodic signal frequency, wherein said non-constant multiple comprises the sum of a constant value plus a time-varying value, and wherein the spectral energy at the sum and difference frequencies of said first and second clock signals is reduced by frequency distribution spreading.

11. The method according to claim 10 wherein said time-varying value comprises a magnitude and a changing frequency.

12. The method according to claim 11 wherein said time-varying value magnitude comprises a value of between about 1 and about 5.

13. The method according to claim 11 wherein said time-varying value changing frequency comprises a value of between about every 2 lines per change and about every 5 lines per change.

14. The method according to claim 10 wherein said periodic signal comprises a video horizontal synchronization signal.

15. The method according to claim 10 wherein said first clock signal comprises a sampling signal for an analog video input signal.

16. The method according to claim 10 wherein said second clock signal comprises synchronizing signal for a digital video output signal.

17. A multiple clock generating circuit having reduced clock noise comprising:
   a means of deriving a first clock signal from a periodic signal wherein said first clock signal has a frequency that is a constant multiple of the frequency of said periodic signal; and
   a phase lock loop for deriving a second clock signal from said periodic signal wherein said second clock signal has a frequency that is a non-constant multiple of said periodic signal frequency, wherein said non-constant multiple comprises the sum of a constant value plus a time-varying value, and wherein the spectral energy at the sum and difference frequencies of said first and second clock signals is reduced by frequency distribution spreading.

18. The circuit according to claim 17 wherein said phase lock loop for deriving said second clock signal from said periodic signal comprises:

a phase error calculator having first input and second input and an output wherein said output comprises a constant voltage plus a voltage proportional to a phase error between said first and second inputs and wherein said first input is coupled to said periodic signal;
   a voltage controlled oscillator having input and output wherein said output comprises a frequency that is proportional to said phase error calculator output, wherein said input is coupled said phase error calculator output, and wherein said output is coupled to said second clock signal; and
   a feedback means having input and output wherein the frequency of said output equals the frequency of said input divided by said non-constant multiple, wherein said input is coupled to said second clock signal, and wherein said output is coupled to said phase error calculator second input.

19. The circuit according to claim 18 wherein said feedback means comprises a counter that is counted once every cycle of said second clock signal.

20. The circuit according to claim 17 wherein said means of deriving a first clock signal from a periodic signal comprises a phase lock loop.

21. The circuit according to claim 17 wherein said time-varying value comprises a magnitude and a changing frequency.

22. The circuit according to claim 21 wherein said time-varying value magnitude comprises a value of between about 1 and about 5.

23. The circuit according to claim 21 wherein said time-varying value changing frequency comprises a value of between about every 2 lines per change and about every 5 lines per change.

24. The circuit according to claim 17 wherein said periodic signal comprises a video horizontal synchronization signal.

25. The circuit according to claim 17 wherein said first clock signal comprises a sampling signal for an analog video input signal.

26. The circuit according to claim 17 wherein said second clock signal comprises synchronizing signal for a digital video output signal.

27. A multiple clock generating circuit having reduced clock noise comprising:
   a means of deriving a first clock signal from a periodic signal wherein said first clock signal has a frequency that is a constant multiple of the frequency of said periodic signal; and
   a phase lock loop for deriving a second clock signal from said periodic signal using a phase lock loop wherein said second clock signal has a frequency that is a non constant multiple of said periodic signal frequency, wherein said non-constant multiple comprises the sum of a constant value plus a time-varying value, wherein the spectral energy at the sum and difference frequencies of said first and second clock signals is reduced by frequency distribution spreading, and wherein said phase lock loop comprises:
   a phase error calculator having first input and second input and an output wherein said output comprises a constant voltage plus a voltage proportional to a phase error between said first and second inputs and wherein said first input is coupled to said periodic signal;
   a voltage controlled oscillator having input and output wherein said output comprises a frequency that is proportional to said phase error calculator output, wherein said input is coupled said phase error calculator output, and wherein said output is coupled to said second clock signal; and a feedback means having input and output wherein the frequency of said output equals the frequency of said input divided by said non-constant multiple, wherein said input is coupled to said second clock signal, and wherein said output is coupled to said phase error calculator second input.

28. The circuit according to claim 27 wherein said feedback means comprises a counter that is counted once every cycle of said second clock signal.

29. The circuit according to claim 27 wherein said means of deriving a first clock signal from a periodic signal comprises a phase lock loop.

30. The circuit according to claim 27 wherein said time-varying value comprises a magnitude and a changing frequency.

31. The circuit according to claim 30 wherein said time-varying value magnitude comprises a value of between about 1 and about 5.

32. The circuit according to claim 30 wherein said time-varying value changing frequency comprises a value of between about every 2 lines per change and about every 5 lines per change.

33. The circuit according to claim 27 wherein said periodic signal comprises a video horizontal synchronization signal.

34. The circuit according to claim 27 wherein said first clock signal comprises a sampling signal for an analog video input signal.

35. The circuit according to claim 27 wherein said second clock signal comprises synchronizing signal for a digital video output signal.

* * * * *